United States Patent
Yong

(10) Patent No.: US 10,133,263 B1
(45) Date of Patent: Nov. 20, 2018

(54) PROCESS CONDITION BASED DYNAMIC DEFECT INSPECTION

(71) Applicant: KLA-Tencor Corporation, Milpitas, CA (US)

(72) Inventor: Poh Boon Yong, Milpitas, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 314 days.

(21) Appl. No.: 14/829,503

(22) Filed: Aug. 18, 2015

Related U.S. Application Data

(60) Provisional application No. 62/038,487, filed on Aug. 18, 2014, provisional application No. 62/183,280, filed on Jun. 23, 2015.

(51) Int. Cl.
  *G06F 19/00* (2018.01)
  *G05B 19/418* (2006.01)
  *H01L 21/66* (2006.01)

(52) U.S. Cl.
  CPC ........ *G05B 19/41875* (2013.01); *H01L 22/20* (2013.01)

(58) Field of Classification Search
  CPC ....... G01N 21/9501; G01N 2033/0095; G01N 21/8851; G03F 1/84
  See application file for complete search history.

(56) References Cited

U.S. PATENT DOCUMENTS

| | | | |
|---|---|---|---|
| 5,859,964 A | 1/1999 | Wang et al. | |
| 5,864,773 A | 1/1999 | Barna et al. | |
| 6,421,574 B1 | 7/2002 | Steffan et al. | |
| 6,442,496 B1 | 8/2002 | Pasadyn et al. | |
| 6,487,511 B1 | 11/2002 | Wooten | |
| 6,560,504 B1 | 5/2003 | Goodwin et al. | |
| 6,740,534 B1 | 5/2004 | Adams, III et al. | |
| 6,895,293 B2 | 5/2005 | Reiss et al. | |
| 6,980,873 B2 | 12/2005 | Shen | |

(Continued)

FOREIGN PATENT DOCUMENTS

| | | |
|---|---|---|
| CN | 103346105 A | 10/2013 |
| WO | 2005017981 A2 | 2/2005 |
| WO | 2009111134 A2 | 9/2009 |

OTHER PUBLICATIONS

Bousetta, A., "Adaptive sampling methodology for in-line defect inspection", Advanced Semiconductor Manufacturing Conference, Date of Conference Apr. 11-12, 2005, pp. 1-7.

(Continued)

*Primary Examiner* — Edward Raymond
(74) *Attorney, Agent, or Firm* — Suiter Swantz pc llo

(57) ABSTRACT

Defect inspection methods and systems that use process conditions to dynamically determine how to perform defect inspections during a semiconductor manufacturing process are disclosed. A defect inspection method may include: obtaining process conditions from a process tool utilized to process at least one wafer; determining whether to perform defect inspection of a layer, a wafer, or a high risk area/spot within the at least one wafer based on the process conditions obtained; bypassing the defect inspection when it is determined not to perform the defect inspection; and performing the defect inspection after the at least one wafer is processed by the process tool when it is determined to perform the defect inspection.

22 Claims, 4 Drawing Sheets

(56) References Cited

U.S. PATENT DOCUMENTS

| | | |
|---|---|---|
| 6,988,017 B2 | 1/2006 | Pasadyn et al. |
| 6,988,045 B2 | 1/2006 | Purdy |
| 7,076,321 B2 | 7/2006 | Purdy |
| 7,228,193 B2 | 6/2007 | Guldi et al. |
| 7,292,959 B1 | 11/2007 | Markle et al. |
| 7,296,103 B1 | 11/2007 | Purdy et al. |
| 7,337,019 B2 | 2/2008 | Reiss et al. |
| 7,460,968 B1 | 12/2008 | Good et al. |
| 7,487,054 B2 | 2/2009 | Ayala et al. |
| 7,567,700 B2 | 7/2009 | Funk et al. |
| 7,698,012 B2 | 4/2010 | Shanmugasundram et al. |
| 7,783,375 B2 | 8/2010 | Shanmugasundram et al. |
| 7,853,920 B2 | 12/2010 | Preil et al. |
| 7,937,179 B2 | 5/2011 | Shimshi et al. |
| 8,017,411 B2 | 9/2011 | Sonderman et al. |
| 8,139,844 B2 | 3/2012 | Chen et al. |
| 8,175,831 B2 | 5/2012 | Izikson et al. |
| 8,392,009 B2 | 3/2013 | Fei et al. |
| 8,559,001 B2 | 10/2013 | Chang et al. |
| 8,594,963 B2 | 11/2013 | Liao et al. |
| 8,612,043 B2 | 12/2013 | Moyne et al. |
| 8,989,888 B2 | 3/2015 | Yun et al. |
| 2006/0129257 A1 | 6/2006 | Chen et al. |
| 2007/0105245 A1* | 5/2007 | Funakoshi ............ G03F 1/84 438/14 |
| 2008/0295048 A1 | 11/2008 | Nehmadi et al. |
| 2009/0282296 A1 | 11/2009 | Lin |
| 2012/0216169 A1 | 8/2012 | Park et al. |
| 2013/0026381 A1 | 1/2013 | Huang et al. |
| 2013/0182101 A1 | 7/2013 | Yong et al. |
| 2014/0210982 A1 | 7/2014 | Zuo et al. |
| 2014/0303921 A1 | 10/2014 | Jayaraman et al. |

OTHER PUBLICATIONS

Guo, R. S. et al., "A real-time equipment monitoring and fault detection system", Date of Conference Jun. 16-17, 1998, pp. 111-123.

\* cited by examiner

US 10,133,263 B1

PROCESS CONDITION BASED DYNAMIC DEFECT INSPECTION

CROSS-REFERENCE TO RELATED APPLICATIONS

The present application claims the benefit under 35 U.S.C. § 119(e) of U.S. Provisional Application Ser. No. 62/038,487, filed Aug. 18, 2014. Said U.S. Provisional Application Ser. No. 62/038,487 is hereby incorporated by reference in its entirety.

The present application also claims the benefit under 35 U.S.C. § 119(e) of U.S. Provisional Application Ser. No. 62/183,280, filed Jun. 23, 2015. Said U.S. Provisional Application Ser. No. 62/183,280 is hereby incorporated by reference in its entirety.

The present application is related to U.S. Provisional Application Ser. No. 62/002,895, filed May 25, 2014. Said U.S. Provisional Application Ser. No. 62/002,895 is hereby incorporated by reference in its entirety.

TECHNICAL FIELD

The disclosure generally relates to the field of defect inspection, and particularly to systems and methods inspection of semiconductor wafers.

BACKGROUND

Thin polished plates such as silicon wafers and the like are a very important part of modern technology. A wafer, for instance, may refer to a thin slice of semiconductor material used in the fabrication of integrated circuits and other devices. Other examples of thin polished plates may include magnetic disc substrates, gauge blocks and the like. While the technique described here refers mainly to wafers, it is to be understood that the technique also is applicable to other types of polished plates as well. The term wafer and the term thin polished plate may be used interchangeably in the present disclosure.

Semiconductor manufacturing processes are typically run in batches called lots. A lot, or a wafer lot, is defined as a number of wafers processed together as a single group. In certain instances, different priorities may be assigned to different lots to indicate how quickly those lots need to be processed. For instance, lots that need to be shipped sooner may be assigned a higher priority than others.

One approach to increase manufacturing throughput of high priority lots is to limit defect inspections to only critical layers and bypass defect inspections of non-critical layers. More specifically, certain process steps of the semiconductor manufacturing process may be identified as critical steps while the rest of the process steps may be considered non-critical. Defect inspections may be performed after the critical steps, but bypassed after the non-critical process steps to help reduce the overall time consumption. It is noted, however, that since this approach is entirely based on predetermined decisions, it is very likely for the defect inspections to miss potential process issues. It is also noted that the likelihood of missing yield excursion may increase as the number of process steps that are predetermined to be critical decreases.

SUMMARY

The present disclosure is directed to a wafer inspection method. The method may include: obtaining process tool parameter data from a process tool utilized to process at least one wafer; determining whether to perform defect inspection of a layer, a wafer, or a high risk area/spot within the at least one wafer based on the process tool parameter data obtained; bypassing the defect inspection when it is determined not to perform the defect inspection; and performing the defect inspection after the at least one wafer is processed by the process tool when it is determined to perform the defect inspection.

Another embodiment of the present disclosure is directed to a wafer manufacturing method. The method may include: processing at least one wafer utilizing a process tool; obtaining process tool parameter data from the process tool; determining whether to perform defect inspection of a layer, a wafer, or a high risk area/spot within the at least one wafer based on the process tool parameter data obtained; bypassing the defect inspection when it is determined not to perform the defect inspection; and performing the defect inspection after the at least one wafer is processed by the process tool when it is determined to perform the defect inspection.

A further embodiment of the present disclosure is directed to a system. The system may include a data interface configured to obtain process tool parameter data from a process tool utilized to process at least one wafer. The system may also include a processor in communication with the data interface that is configured to determine whether to perform defect inspection of a layer, a wafer, or a high risk area/spot within the at least one wafer based on the process tool parameter data obtained. The system may further include an inspection device configured to bypass the defect inspection when it is determined not to perform the defect inspection, and to perform the defect inspection after the at least one wafer is processed by the process tool when it is determined to perform the defect inspection.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Embodiments of the present disclosure are directed to systems and methods that are configured to use process conditions to dynamically determine how to perform defect inspections during a semiconductor manufacturing process. As will be described in details below, rule based process criticalities may be dynamically determined to identify potential process issues, which may in turn improve the likelihood of identifying potentially defective wafers and allow users (e.g., engineers) to understand process issues quickly and efficiently.

Figure 1:
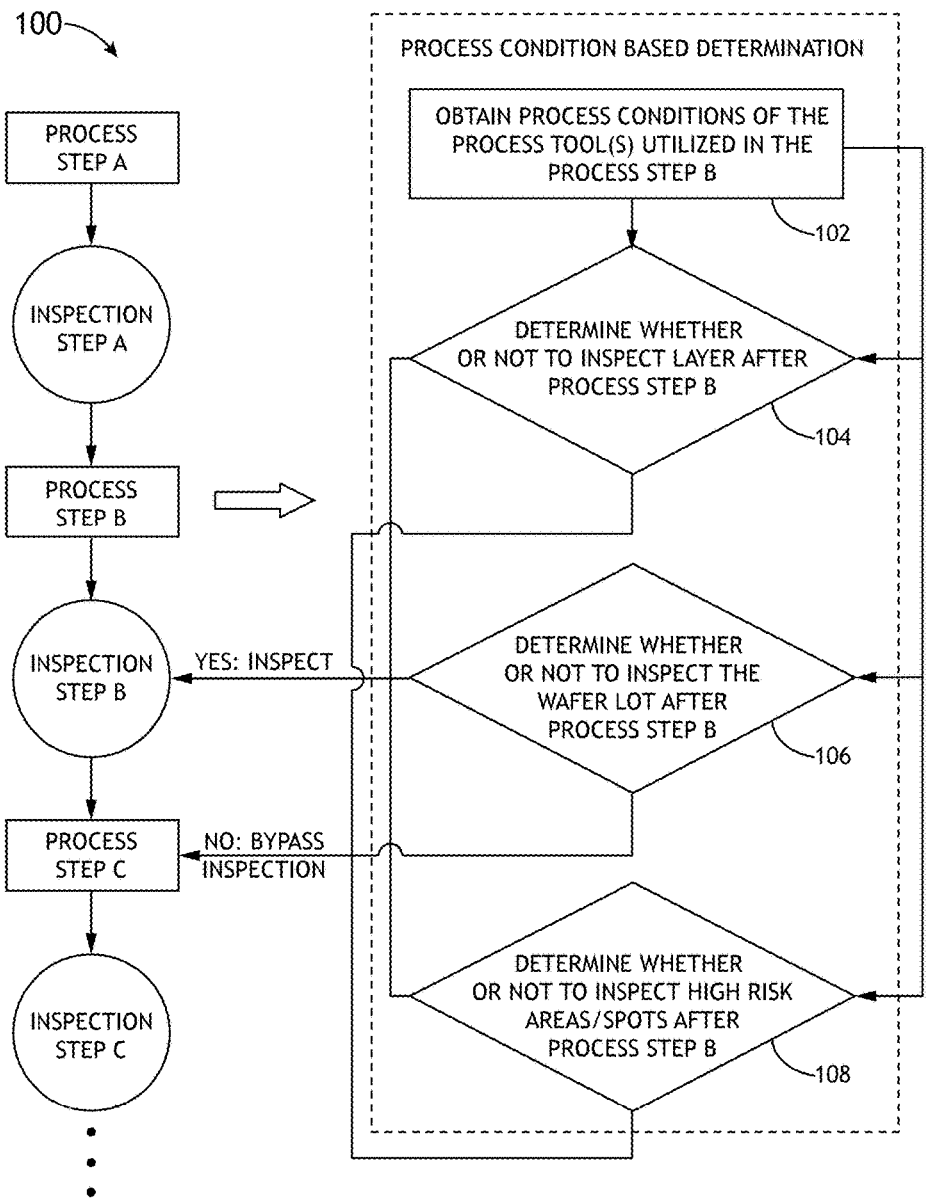
FIG. 1 is a flow diagram depicting a simplified semiconductor manufacturing process utilizing a process condition based dynamic inspection method in accordance with embodiments of the present disclosure.

Referring now to FIG. 1, a flow diagram depicting a simplified semiconductor manufacturing process 100 is shown. For illustrative purposes, suppose that the process steps A and C are designated as critical steps, meaning that defect inspection after process steps A and C are required. Further suppose that the process step B is not designated as a critical step (i.e., step B is a non-critical step), meaning that defect inspection after process step B is optional.

In accordance with embodiments of the present disclosure, defect inspection after process step B (i.e., a non-critical step) may be bypassed conditionally based on process conditions of the equipment/tools utilized in the process step B. For instance, as shown in FIG. 1, process conditions (e.g., information regarding gas flow, temperature, pressure or the like) of the equipment used in the process step B may be obtained in a step 102 using Fault Detection and Classification (FDC) modules or equipment sensors and the like. It is noted that process conditions obtained in this manner may contain many process tool parameters that are indicative of whether the process step B is performing within a predefined specification (may be referred to as in-spec or in-control) or out of specification (may be referred to as out-of-spec or out-of-control). The process conditions obtained in this manner may therefore be further processed in a step 104 to help determine whether or not to perform defect inspection after process step B.

Figure 2:
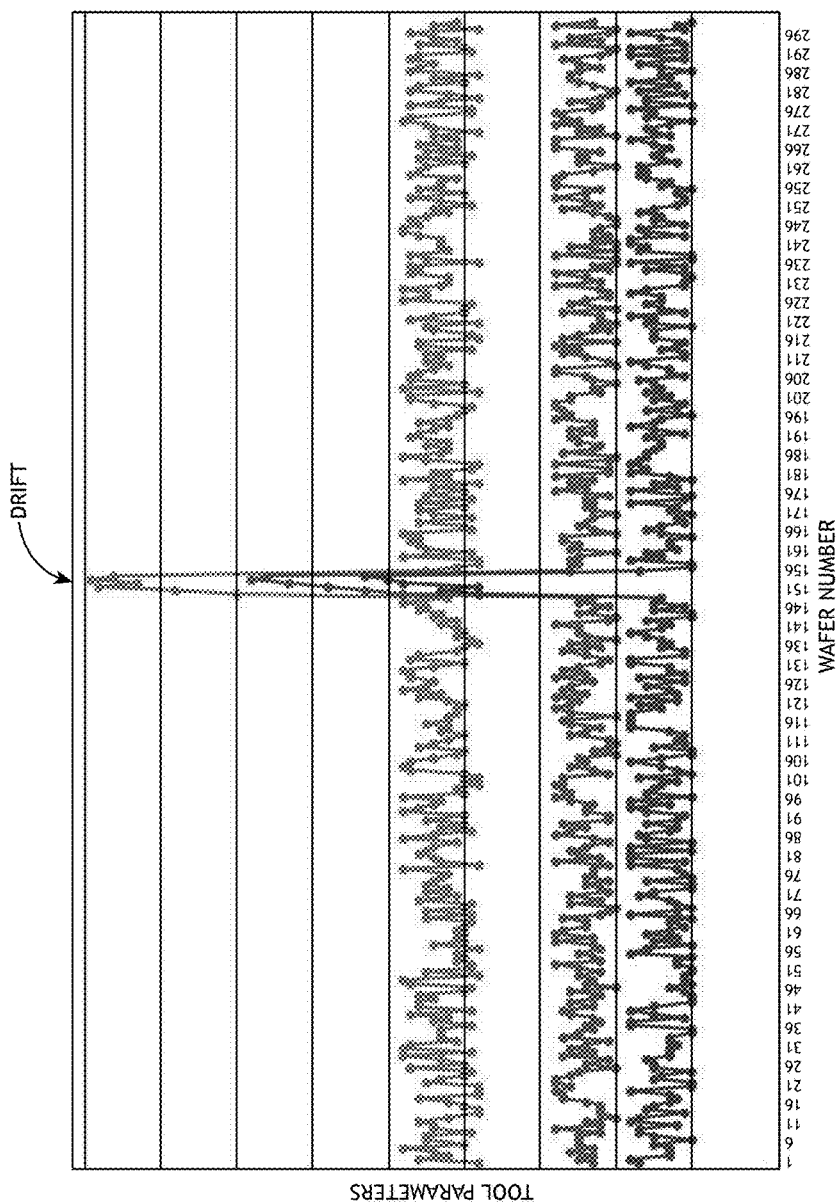
FIG. 2 is an illustration depicting a chart containing the trend of several process tool parameters used by a particular process step over a number of production runs.

FIG. 2 is an illustration depicting a chart containing the trend of several process tool parameters used by a particular process step over a number of production runs. For illustrative purposes, suppose an anomaly (e.g., a drift) is observed in the process tool parameters, which may suggest that the process step is relatively unstable and may therefore introduce some defects that may require additional inspection. Relating back to the example depicted in FIG. 1, if the process tool parameters obtained in step 102 exhibit certain characteristics that suggest the process step B may be introducing (or have introduced) possible defects to the current layer, step 104 may recognize these characteristics and decide to perform defect inspection of the layer after the process step B even though the process step B is a non-critical step.

It is to be understood that the illustration depicted in FIG. 2 is merely exemplary and that different process tool parameters may exhibit characteristics that are different from those shown in FIG. 2. It is contemplated that because a semiconductor manufacturing process may include a number of different process steps, which may in turn utilize a number of different process tools, the types of process tool parameters that can be obtained in step 102 may not be limited to information regarding gas flow, temperature, pressure or the like and may vary without departing from the spirit and scope of the present disclosure.

It is also contemplated that the criteria used in step 104 for deciding whether or not to perform defect inspection of the layer may also vary without departing from the spirit and scope of the present disclosure. In certain implementations, for instance, step 104 may be carried out based on user-defined single-variate control rules expressed using Statistical Process Control (SPC) charts with Western Electric or Nelson Rules and the like. Alternatively and/or additionally, step 104 may be carried out based on multi-variate control rules such as those expressed using Principal Component Analysis (PCA) and the like. It is to be understood that the specific references to the process control techniques mentioned herein are merely exemplary and are not meant to be limiting. It is contemplated that other types of statistical analysis methods and/or process control techniques may be utilized in step 104 without departing from the spirit and scope of the present disclosure.

It is further contemplated that the references to the "process step B" depicted in the examples above are generic and are not meant to be limiting. It is to be understood that the process condition based dynamic inspection method described above may be applicable to any process steps included in a manufacturing process without departing from the spirit and scope of the present disclosure.

It is noted that the process condition based dynamic inspection method described herein may also be configured to determine (in a step 106) whether or not certain individual wafers within a group of wafers (lot) should be inspected based on the process conditions obtained. It is contemplated that providing the abilities to dynamically identify and inspect selected wafers may be preferred in certain instances over inspecting an entire lot because inspecting selected wafers may help take into account the process condition variations within the lot, which may lead to inspection results that better represent actual process issues.

Referring back to FIG. 2 again, suppose the production runs shown in FIG. 2 represent the productions runs carried out for a particular group of wafers. Continuing with the example presented above, step 104 of the process condition based dynamic inspection method may decide to perform defect inspection of the layer after the process step B because an anomaly (e.g., a drift) has been detected. However, instead of inspecting every wafer within the lot, step 106 may decide to only inspect wafers that are most likely affected by the anomaly.

It is contemplated that step 106 may utilize various statistical analysis methods and/or process control techniques to help identify the wafers that are most likely affected by the anomaly. For instance, in certain implementations, wafers that have been processed around the time when the anomaly occurred may be identified as the wafers that are most likely affected by the anomaly. It is to be understood, however, that other statistical analysis methods and/or process control techniques may be utilized to help identify the wafers that are most likely affected by the anomaly (or anomalies) without departing from the spirit and scope of the present disclosure.

It is noted that the process condition based dynamic inspection method described herein may be further configured to help identify high risk areas/spots within the wafers that should be inspected (in a step 108). It is contemplated that providing the abilities to dynamically identify high risk areas/spots may be preferred in certain instances over fixedly chosen inspection regions because the dynamic identification process may help reduce the number of defect-of-interest (DOI) areas/spots that may otherwise be overlooked, allowing the inspection process to take into account process variability with respect to design sensitivity and to capture relevant process issues more effectively.

Figure 3:
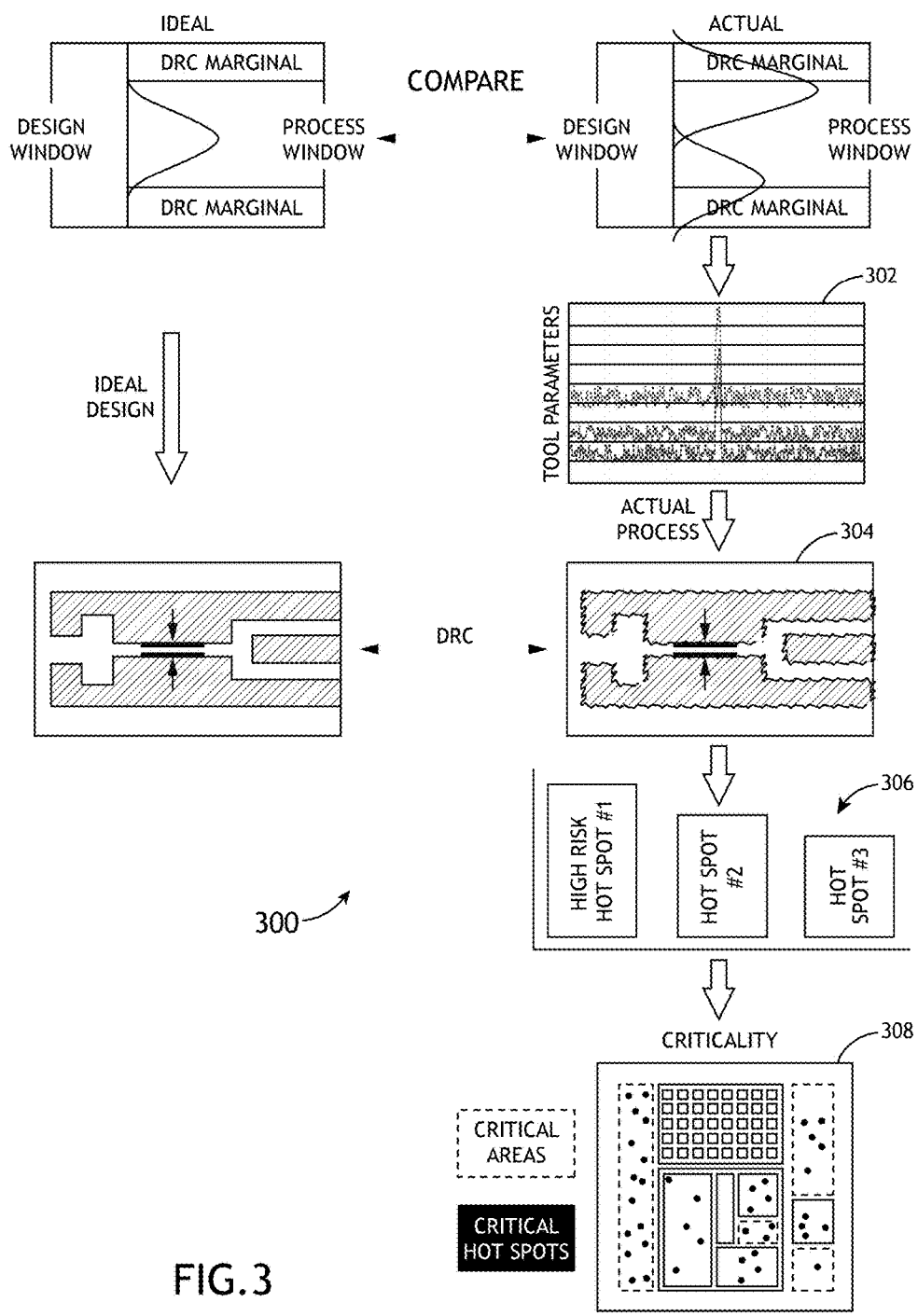
FIG. 3 is a flow diagram depicting a method that may be utilized to identify high risk areas/spots within the wafers.

FIG. 3 is an illustration depicting an exemplary process 300 that may be utilized in step 108 to help identify high risk areas/spots within the wafers. As shown in FIG. 3, process conditions obtained from the actual process steps may be utilized in a step 302 to identify wafers that should be inspected (as previously described). A Design Rule Checking (DRC) process may then be carried out in a step 304 to determine whether the physical layouts of the processed wafers satisfy the design rules. If the result of the DRC is unsatisfactory, the DRC process may provide (in a step 306) a list of high risk areas and/or a list of high risk spots that may require further inspections. The location/coordinates of these high risk areas/spots may then be reported or forwarded (in a step 308) to one or more inspection devices so that these high risk areas/spots can be inspected.

It is contemplated that the inspection device(s) may be configured to dynamically update the inspection recipe upon receiving the coordinates of the high risk areas/spots. The inspection device(s) may also optimize their settings with respect to the information received about the high risk areas/spots. For instance, the inspection device(s) may optimize their settings, such as sensitivity, pixel size, optical modes, filtering methods and the like based on the information received about the high risk areas/spots.

It is also contemplated that the references to Design Rule Checking (DRC) process described above is merely exemplary and are not meant to be limiting. It is understood that other analysis techniques, including Critical Area Analysis (CM), Process Window Qualification (PWQ), Focus and Exposure Matrix (FEM), Optical Proximity Check (OPC), Design Based Binning (DBB) or the like, may be utilized to help identify high risk areas/spots without departing from the spirit and scope of the present disclosure.

Figure 4:
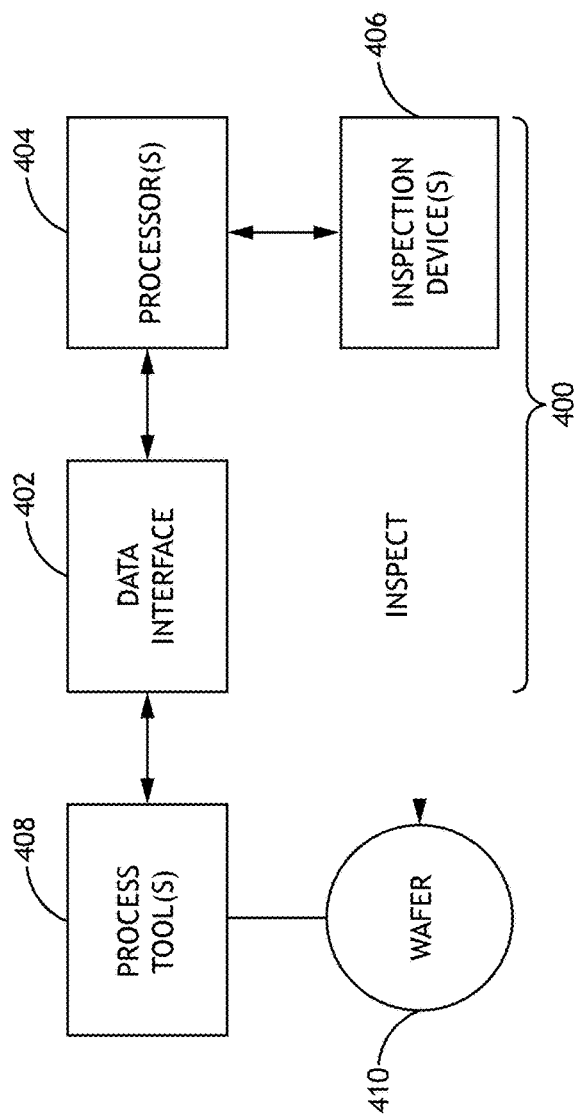
FIG. 4 is a block diagram depicting an embodiment of an inspection system in accordance with the present disclosure.

Referring now to FIG. 4, a block diagram depicting an embodiment of an inspection system 400 in accordance with the present disclosure is shown. The inspection system 400 may include a data interface 402 configured to obtain process tool parameter data from at least one process tool 408 used to process at least one wafer 410. The inspection system 400 may also include at least one processor 404 configured to process the parameter data obtained by the data interface 402 and determine whether to inspect the wafer(s) 410 and/or any of the high risk areas/spots within the wafer(s) 410. If the processor 404 determines that the wafer(s) 410 and/or some of the high risk areas/spots within the wafer(s) 410 should be inspected, the processor 404 may communicate with one or more inspection devices 406 to inspect the wafer(s) 410 and/or some of the high risk areas/spots within the wafer(s) 410 as described above.

It is contemplated that while the examples above referred to wafer inspections, the systems and methods in accordance with the present disclosure are applicable to other types of polished plates as well without departing from the spirit and scope of the present disclosure. The term wafer used in the present disclosure may include a thin slice of semiconductor material used in the fabrication of integrated circuits and other devices, as well as other thin polished plates such as magnetic disc substrates, gauge blocks and the like.

It is contemplated that the methods disclosed herein may be implemented in various wafer geometry measurement tools as sets of instructions executed by one or more processors, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A wafer inspection method comprising:
obtaining manufacturing process tool parameter data from a manufacturing process tool configured to process at least one wafer;
determining whether to bypass a defect inspection process of the at least one wafer or perform a defect inspection process of the at least one wafer based on the obtained manufacturing process tool parameter data; and
performing the defect inspection process of the at least one wafer in response to a determination to perform the defect inspection.

2. The method of claim 1, wherein said determining whether to perform a defect inspection process is based on whether the obtained manufacturing process tool parameter data exhibits at least one anomaly.

3. The method of claim 2, wherein the at least one wafer includes a plurality of wafers, and wherein said determining whether to perform a defect inspection process further comprises:
determining whether to perform defect inspection of an entirety of the plurality of wafers or a selected subset of the plurality of wafers.

4. The method of claim 3, wherein the selected subset of the plurality of wafers includes wafers identified to be most likely affected by the at least one anomaly, wherein the at least one anomaly is identified by obtained manufacturing process tool parameter data relating to a process condition of at least one of a gas flow, a temperature, or a pressure.

5. The method of claim 1, wherein said performing the defect inspection process of the at least one wafer further comprises:
identifying at least one of a high risk area and a high risk spot within the at least one wafer; and
performing the defect inspection process of the at least one of the high risk area and the high risk spot identified.

6. The method of claim 5, wherein said performing the defect inspection process of the at least one wafer further comprises:
adjusting settings of at least one inspection device utilized to perform the defect inspection process based on the at least one of the high risk area and the high risk spot identified.

7. The method of claim 1, wherein said performing the defect inspection process of the at least one wafer is performed prior to processing the at least one wafer utilizing another manufacturing process tool.

8. A wafer manufacturing method comprising:
processing at least one wafer utilizing a manufacturing process tool;
obtaining manufacturing process tool parameter data from the manufacturing process tool;
determining whether to bypass a defect inspection process of the at least one wafer or perform a defect inspection process of the at least one wafer based on obtained manufacturing process tool parameter data; and performing the defect inspection process of the at least one wafer in response to a determination to perform the defect inspection.

9. The method of claim 8, wherein said performing the defect inspection process of the at least one wafer is performed prior to processing the at least one wafer utilizing another manufacturing process tool.

10. The method of claim 8, wherein said determining whether to perform the defect inspection process is based on whether the obtained manufacturing process tool parameter data exhibits at least one anomaly.

11. The method of claim 9, wherein the at least one wafer includes a plurality of wafers, and wherein said determining whether to perform the defect inspection process further comprises:

determining whether to perform the defect inspection process of an entirety of the plurality of wafers or a selected subset of the plurality of wafers.

12. The method of claim 11, wherein the selected subset of the plurality of wafers includes wafers identified to be most likely affected by the at least one anomaly, wherein the at least one anomaly is identified by obtained manufacturing process tool parameter data relating to a process condition of at least one of a gas flow, a temperature, or a pressure.

13. The method of claim 8, wherein said performing the defect inspection process of the at least one wafer further comprises:

identifying at least one of a high risk area and a high risk spot within the at least one wafer; and performing the defect inspection process of the at least one of the high risk area and the high risk spot identified.

14. The method of claim 13, wherein said performing the defect inspection process of the at least one wafer further comprises:

adjusting settings of at least one inspection device utilized to perform the defect inspection process based on the at least one of the high risk area and the high risk spot identified.

15. A system comprising:

a data interface, the data interface configured to obtain manufacturing process tool parameter data from a manufacturing process tool configured to process at least one wafer;

a processor in communication with the data interface, the processor configured to determine whether to bypass a defect inspection process of the at least one wafer or perform a defect inspection process of the at least one wafer based on obtained manufacturing process tool parameter data; and an inspection device in communication with the processor, wherein the processor is configured to direct the inspection device to perform the defect inspection process of the at least one wafer in response to a determination to perform the defect inspection.

16. The system of claim 15, wherein the processor determines whether to perform the defect inspection process based on whether the obtained manufacturing process tool parameter data exhibits at least one anomaly.

17. The system of claim 16, wherein the at least one wafer includes a plurality of wafers, and wherein the processor is further configured to determine whether to perform the defect inspection process of an entirety of the plurality of wafers or a selected subset of the plurality of wafers.

18. The system of claim 17, wherein the selected subset of the plurality of wafers includes wafers identified to be most likely affected by the at least one anomaly, wherein the at least one anomaly is identified by obtained manufacturing process tool parameter data relating to a process condition of at least one of a gas flow, a temperature, or a pressure.

19. The system of claim 15, wherein the processor is further configured to identify at least one of a high risk area and a high risk spot within the at least one wafer and provide location information of the at least one of the high risk area and the high risk spot to the inspection device.

20. The system of claim 19, wherein the inspection device is further configured to adjust defect inspection process settings based on the at least one of the high risk area and the high risk spot identified.

21. A wafer inspection method comprising:

obtaining manufacturing process tool parameter data from a manufacturing process tool configured to process at least one wafer;

determining whether to bypass a defect inspection process of the at least one wafer or perform a defect inspection process of the at least one wafer based on the obtained manufacturing process tool parameter data; and bypassing the defect inspection process of the at least one wafer in response to the determination to bypass the defect inspection.

22. A system comprising:

a data interface, the data interface configured to obtain manufacturing process tool parameter data from a manufacturing process tool configured to process at least one wafer;

a processor in communication with the data interface, the processor configured to determine whether to bypass a defect inspection process of the at least one wafer or perform a defect inspection process of the at least one wafer based on obtained manufacturing process tool parameter data; and an inspection device in communication with the processor, wherein the processor is configured to direct the inspection device to bypass the defect inspection process of the at least one wafer in response to a determination to bypass the defect inspection.

* * * * *